(12) United States Patent
Masaoka

(10) Patent No.: US 7,181,841 B2
(45) Date of Patent: Feb. 27, 2007

(54) METHOD OF CONFIRMING CONNECTION OF A TERMINAL CONNECTING PORTION

(75) Inventor: Hiroaki Masaoka, Nagoya (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 73 days.

(21) Appl. No.: 11/067,908

(22) Filed: Mar. 1, 2005

(65) Prior Publication Data

US 2005/0148233 A1  Jul. 7, 2005

Related U.S. Application Data

(62) Division of application No. 09/987,416, filed on Nov. 14, 2001, now abandoned.

(30) Foreign Application Priority Data

Nov. 15, 2000 (JP) ............................. 2000-347885

(51) Int. Cl.
*H01R 43/04* (2006.01)
*H01R 13/11* (2006.01)

(52) U.S. Cl. ............................. 29/861; 29/593; 29/884; 439/79; 439/850; 439/856; 324/538

(58) Field of Classification Search .................. 29/861, 29/862, 857, 593, 837, 845, 854, 884; 439/79, 439/176, 650, 700, 850, 856; 324/538
See application file for complete search history.

(56) References Cited

U.S. PATENT DOCUMENTS

| | | | |
|---|---|---|---|
| 2,870,424 A | * | 1/1959 | Franz ............................ 439/79 |
| 4,965,928 A | | 10/1990 | Verge |
| 5,192,232 A | | 3/1993 | Lenz et al. |
| 5,455,515 A | * | 10/1995 | Saijo et al. .................. 324/538 |
| 5,598,624 A | | 2/1997 | Ito et al. |
| 6,244,909 B1 | | 6/2001 | Okada et al. |

FOREIGN PATENT DOCUMENTS

| | | | | |
|---|---|---|---|---|
| JP | A-1-93141 | | 4/1989 | |
| JP | 4-58474 | * | 2/1992 | ............. 439/856 X |

* cited by examiner

*Primary Examiner*—A. Dexter Tugbang
(74) *Attorney, Agent, or Firm*—Oliff & Berridge, PLC

(57) ABSTRACT

Electrically conductive movable elements 15 which are moved from a waiting position to a conduction position by an insertion operation of corresponding male terminals 7 are disposed in all female terminals 9 into which the male terminals are to be respectively inserted in a correct connection condition. Only when the male terminals 7 are correctly inserted into the female terminals 9, the movable elements 15 are moved to the conduction positions to be in contact with conductive portions 17 of a conduction test device 16, respectively, thereby establishing a conductive condition.

4 Claims, 7 Drawing Sheets

METHOD OF CONFIRMING CONNECTION OF A TERMINAL CONNECTING PORTION

This is a Division of application Ser. No. 09/987,416 filed Nov. 14, 2001, now abandoned the entire disclosure of which is hereby incorporated by reference herein in its entirety.

BACKGROUND OF THE INVENTION

1. Technical Field

The present invention relates to a method and apparatus for confirming whether a correct connection condition is attained or not in a terminal connecting portion in which male terminals are inserted respectively into female terminals to make an electrical connection therebetween.

2. Related Art

The conventional art will be described with taking as an example a terminal connecting portion of a junction block serving as an electric junction box in which an electronic control unit used in an automobile is connected to a power source line, a grounding line, switch signal lines, motor signal lines, and the like.

As shown in FIG. 11, a junction block A is configured by housing a bus bar plate 4 formed by resin-molding a plurality of bus bars 3, between lower and upper cases 1 and 2. A printed circuit board 5 of an electronic control unit is mounted on the upper case 2 of the junction block A, and then covered by a lid 6.

Male terminals (tab terminals) 7 are disposed on the bus bars 3 with being directed upward. The male terminals 7 are passed through the printed circuit board 5, and then inserted respectively into female terminals (not shown in the figure) of a connector 8 which is disposed on the board 5. As a result, the male and female terminals are connected to each other so as to make electrical connections between the bus bars 3 and the printed circuit board 5.

FIGS. 12 and 13 show a structure for connecting the male terminals 7 of the bus bars 3 with the female terminals 9 of the connector 8.

Each of the female terminals 9 is formed into a rectangular tubular shape by an electrically conductive thin metal plate, and disposed in a space defined by a connector base 10 and a connector cover 11. The reference numeral 9a denotes an elastic contact piece of the female terminal 19, and 9b denotes a connect piece which is connected by soldering to a wiring 12 of the printed circuit board 5.

Each of the male terminals 7 is passed through holes 13 and 14 of the printed circuit board 5 and the connector base 10 to be inserted into the corresponding one of the female terminals 9, and then caused to be in elastic contact with the elastic contact piece 9a by the spring force of the piece so as to be electrically connected to the female terminal 9.

[Problems to be Solved]

In such a terminal connecting structure, a connection error such as that the male terminal 7 is erroneously inserted into one of the female terminals 9 which is deviated by one terminal position from the correct female terminal, or that the insertion depth is insufficient may be caused because of the following reasons:

(1) the male and female terminals 7 and 9 are not always in correspondence relationships (the male terminals 7 are sometimes smaller in number than the female terminals); and (2) the fitting condition of the terminals 7 and 9 cannot be sometimes visually confirmed.

Conventionally, a method of checking whether a correct connection condition is attained or not is therefore performed by experimentally operating the electronic control unit so as to actually activate functions. This functional test causes the conforming work to be cumbersome.

Even when the connection condition is incorrect, the incorrect condition is not always detected as a malfunction, and hence the confirmation is inaccurately performed, so that the reliability is lowered. In consideration of this, visual confirmation or the like is performed as far as possible, or the connecting work must be carefully conducted with attention. Therefore, the efficiency of the connecting work is lowered.

SUMMARY OF THE INVENTION

It is an object of the invention to provide a method and apparatus for confirming connection of a terminal connecting portion in which a connection condition of male and female terminals can be easily confirmed simply by performing a conduction check after connection, and correctness of the connection condition can be accurately judged.

[Means for Solving the Problems]

According to a first aspect of the invention (confirming method), in a method of confirming connection of a terminal connecting portion in which a plurality of male terminals are inserted respectively into a plurality of female terminals to make an electrical connection therebetween, electrically conductive movable elements are disposed in at least all to-be-connected female terminals into which the male terminals are to be respectively inserted in a correct connection condition, each of the movable elements being moved from a waiting position to a conduction position by an insertion operation of corresponding one of the male terminals, and a state where all of the movable elements in the to-be-connected female terminals are moved respectively to the conduction positions is detected by a conduction test device having conductive portions which, when the movable elements are moved to the conduction positions, are in contact with the movable elements, respectively.

According to a second aspect of the invention (confirming apparatus), in an apparatus for confirming connection of a terminal connecting portion in which a plurality of male terminals are inserted respectively into a plurality of female terminals to make an electrical connection therebetween, the apparatus comprises electrically conductive movable elements, and a conduction test device; the movable elements are disposed respectively in at least all to-be-connected female terminals into which the male terminals are to be respectively inserted in a correct connection condition, in a state where each of the movable elements is moved from a waiting position to a conduction position by an insertion operation of corresponding one of the male terminals; the conduction test device has conductive portions which, when the movable elements are moved to the conduction position, are in contact with the movable elements, respectively; and, when all of the movable elements in the to-be-connected female terminals are moved to the conduction positions, the conduction portions become conductive.

According to a third aspect of the invention, in the configuration of the second aspect, each of the movable elements is configured by integrating a conductor which is to be in contact with corresponding one of the conductive portions of the conduction test device, with an insulator which is to be in contact with and pushed by corresponding one of the male terminals.

According to a fourth aspect of the invention, in the configuration of the second or third aspect, the movable elements are disposed in only the to-be-connected female terminals of all the female terminals, and the conductive portions of the conduction test device are placed to be in contact with the movable elements, respectively.

According to a fifth aspect of the invention, in the configuration of the second or third aspect, the movable elements are disposed in all the female terminals including the to-be-connected female terminals, and the conductive portions of the conduction test device are placed to be in contact with the movable elements in only the to-be-connected female terminals, respectively.

According to a sixth aspect of the invention, in the configuration of any one of the second to fifth aspects, the male terminals are respectively disposed on bus bars in a junction block, and the female terminals are respectively disposed in connectors of a printed circuit board of an electronic control unit which is to be mounted on the junction block.

According to the method and the apparatus, only when the male terminals are correctly inserted into the female terminals (at the correct positions and in the correct depth), the movable elements are moved to the respective conduction positions to be in contact with the conductive portions of the conduction test device, thereby attaining a connection condition.

Unlike the conventional art, namely, a functional test which is cumbersome, and in which detection is not always correct is not performed, and a continuity test for checking only whether the conductive portions are conductive or nonconductive is performed. Therefore, correctness of the connection condition can be easily and accurately detected.

According to the configuration of the third aspect, since the portion of each movable element which is to be in contact with and pushed by the corresponding male terminal is configured by the insulator, the current of the conduction test is prevented from flowing through the movable element toward the male terminals (in the sixth aspect, to the side of the bus bars), and hence the conduction test can be performed more accurately.

According to the configuration of the fourth aspect, the movable elements are requested to be disposed in only the to-be-connected female terminals into which the male terminals are to be inserted, and therefore the movable elements can be reduced to a required minimum number.

By contrast, according to the configuration of the fifth aspect, the movable elements can be mechanically set into all the female terminals. Therefore, it is possible to eliminate a labor of selecting female terminals, and also to prevent the female terminals from being erroneously selected.

DETAILED DESCRIPTION OF THE PREFERRED EMBODIMENTS

[Mode for Carrying out the Invention]

Embodiments of the invention will be described with reference to FIGS. 1 to 10.

(First Embodiment) (see FIGS. 1 to 6)

Figure 1:
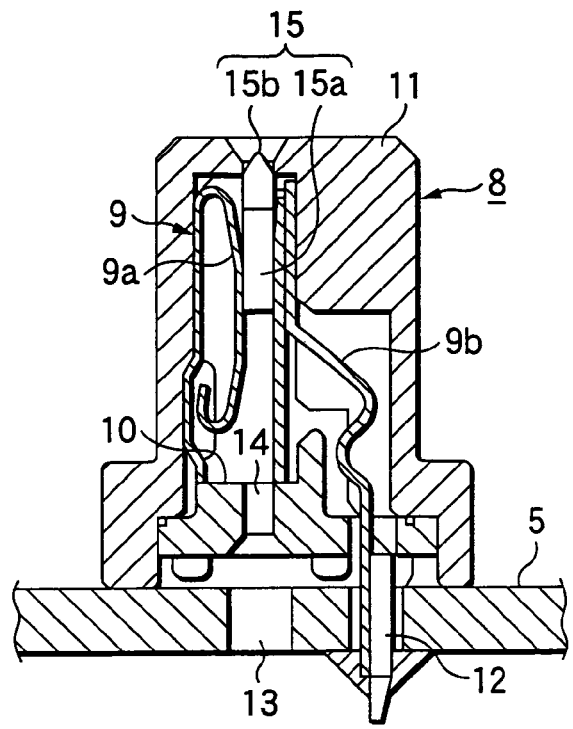
FIG. 1 is a section view of a connector to which a conduction confirming apparatus of a first embodiment of the invention is applied.
Figure 2:
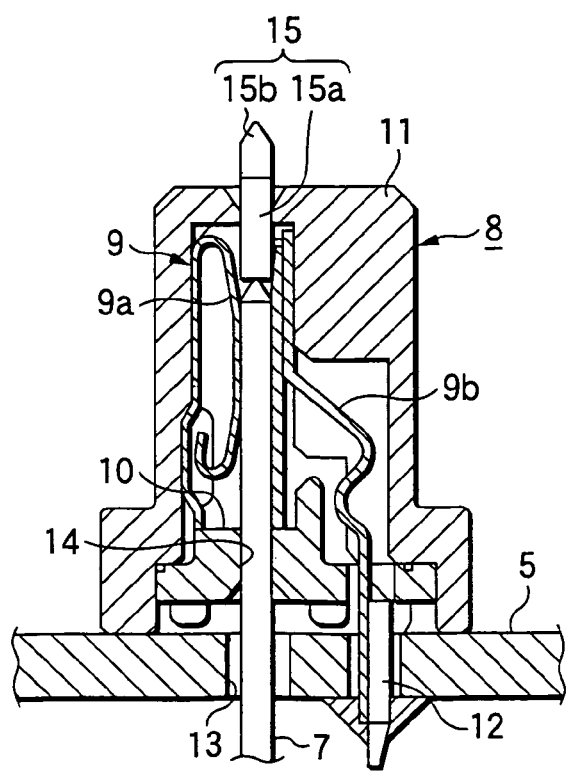
FIG. 2 is a view corresponding to FIG. 1 and showing a state where a male terminal is inserted into a female terminal of the connector.

As shown in FIGS. 1 and 2, a movable element 15 is disposed in each of female terminals 9 of a connector 8. When a male terminal 7 is inserted into the female terminal 9, the movable element 15 is pressed (pushed up) so as to be moved from a waiting position in the connector 8 and shown in FIG. 1, to the outside of the connector 8 as shown in FIG. 2 or to a conduction position.

The movable element 15 is configured by integrating by adhesion or the like an electrical insulator 15a which is to be in contact with the male terminal 7, and which is the lower half of the element in the figure, with a conductor 15b which is the upper half. At the conduction position, the conductors 15b are in contact with conductive portions 17 of a conduction test device 16 which is shown in FIG. 3 and subsequent figures, thereby establishing a conductive condition.

FIGS. 3 to 6 diagrammatically show this condition. In this case, the male terminals 7 are continuously disposed at predetermined intervals, and the female terminals 9 are larger in number than the male terminals 7 (in the illustrated example, seven male terminals 7 are disposed, and eight female terminals 9 are disposed).

The movable elements 15 are disposed in respective to-be-connected female terminals (in the illustrated example, seven ones of all the eight female terminals, excluding the right end one) into which the male terminals 7 are to be inserted in a correct connection condition, among all the female terminals 9 (hereinafter, the to-be-connected female terminals are denoted by the reference numeral 9 only, and the female terminal into which none of the male terminals 7 are to be inserted is referred to as the excess female terminal and denoted by a reference numeral 9').

Figure 3:
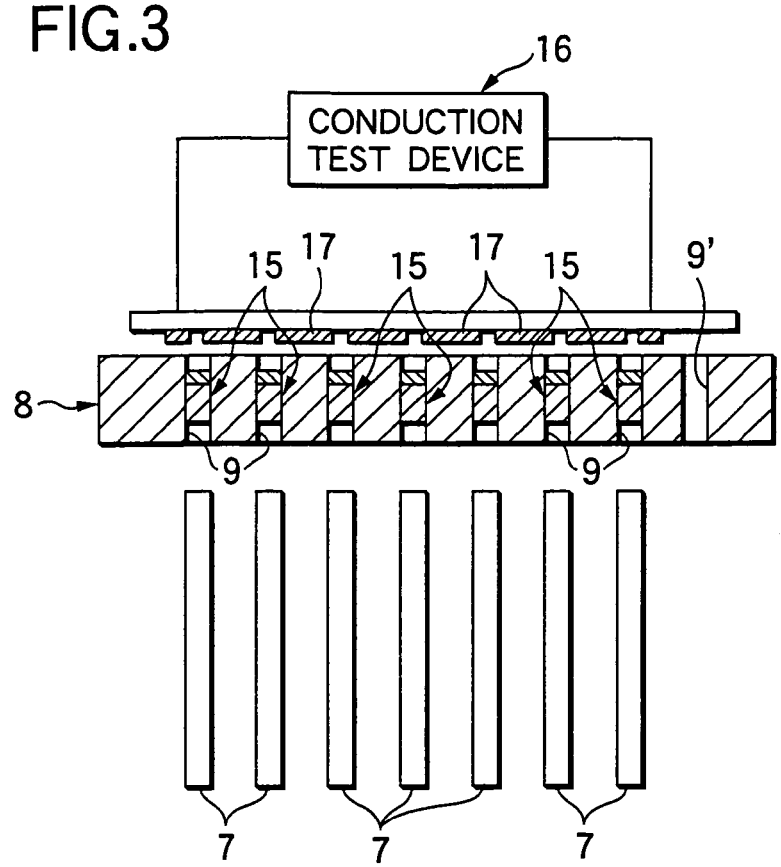
FIG. 3 is a diagrammatic section view showing the case where the positional relationships between male and female terminals are correct.
Figure 4:
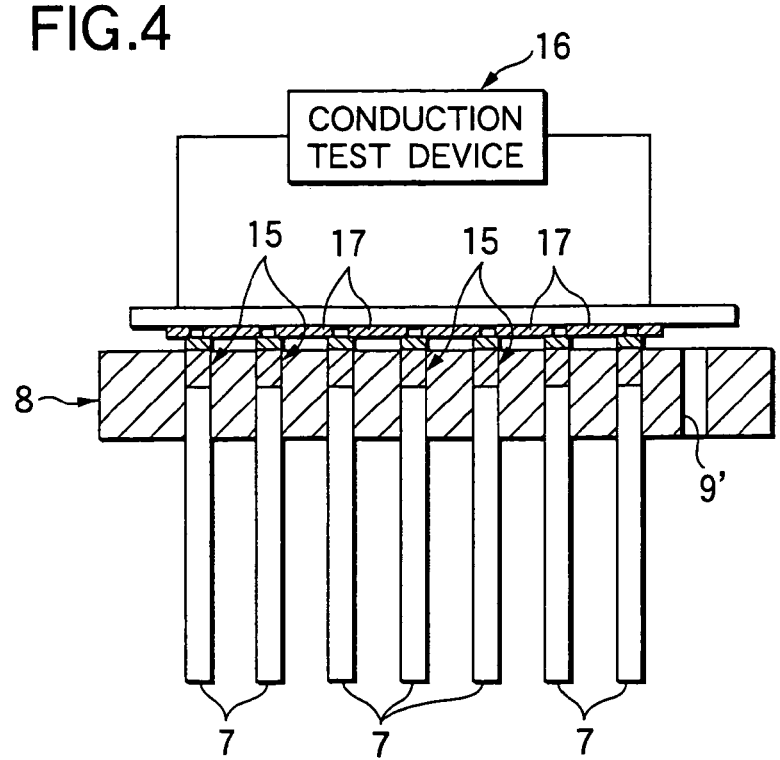
FIG. 4 is a view corresponding to FIG. 3 and showing a state where the male terminals are inserted into the female terminals.
Figure 5:
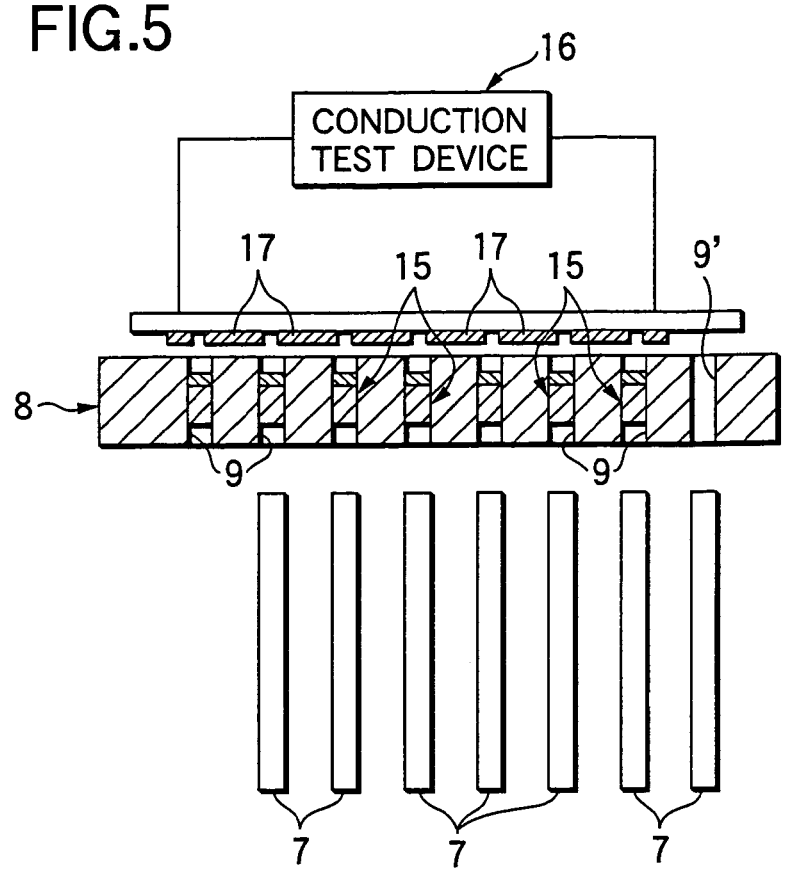
FIG. 5 is a diagrammatic section view showing the case where the positional relationships between male and female terminals are incorrect.
Figure 6:
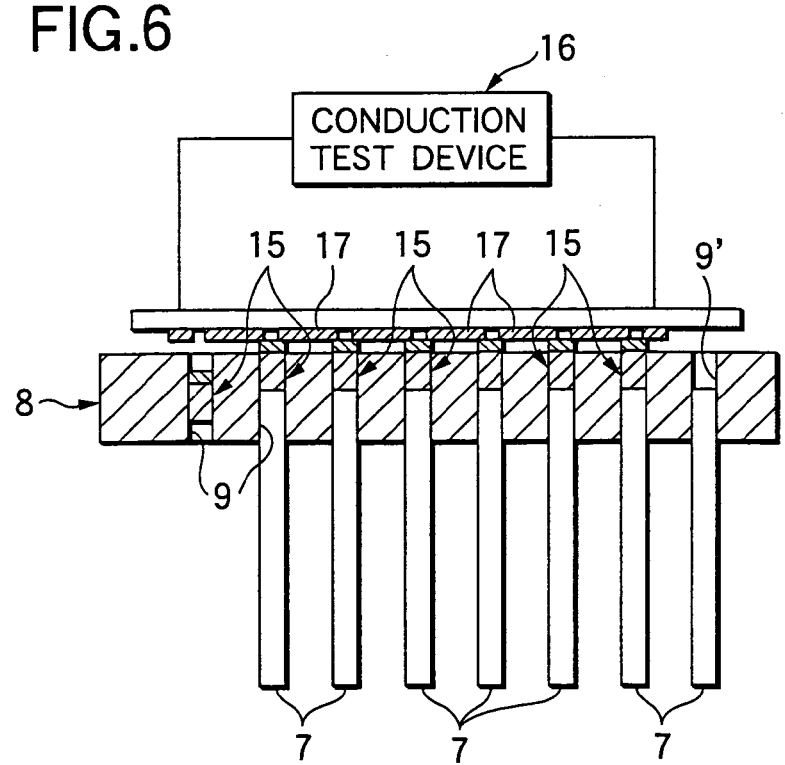
FIG. 6 is a view corresponding to FIG. 5 and showing a state where the male terminals are inserted into the female terminals.

FIGS. 3 and 4 show the case where the male terminals 7 are correctly connected in positions corresponding to the to-be-connected female terminals 9, and FIGS. 5 and 6 show the case where the male and female terminals 7 and 9 are incorrectly connected to each other with being deviated by one terminal position in positional relationship.

The conductive portions 17 of the conduction test device 16 are arranged so as to attain a conductive condition when the adjacent portions are short-circuited by the conductors 15b of the movable elements 15. In the correct connection condition, as shown in FIG. 4, the conductors 15b of the movable elements 15 are placed at respective conductive portion short circuit positions, and hence the conductive condition is detected.

By contrast, in the incorrect connection condition shown in FIGS. 5 and 6, the movable element 15 which does not correspond to none of the male terminals 7, and which is at the left end in the figure is not moved to the conduction position, and therefore the conductive condition of the conductive portions 17 of the conduction test device 16 is not attained.

Even when the positional relationships of the male and female terminals 7 and 9 are correct, in the case where the male terminals 7 are not sufficiently inserted into the female terminals 9 to a required depth, the movable elements 15 fail to reach the respective conduction positions. Also in this case, therefore, the conductive condition of the conductive portions 17 is not attained.

As a result, the conduction test device 16 indicates the nonconductive condition, and the connection abnormality is detected.

As described above, unlike the conventional art, a functional test which is cumbersome, and in which detection is not always accurate is not performed, and a continuity test for checking only whether the conductive portions are conductive or nonconductive is performed by the conduction test device 16. Therefore, correctness of the connection condition can be easily and accurately detected.

Figure 11:
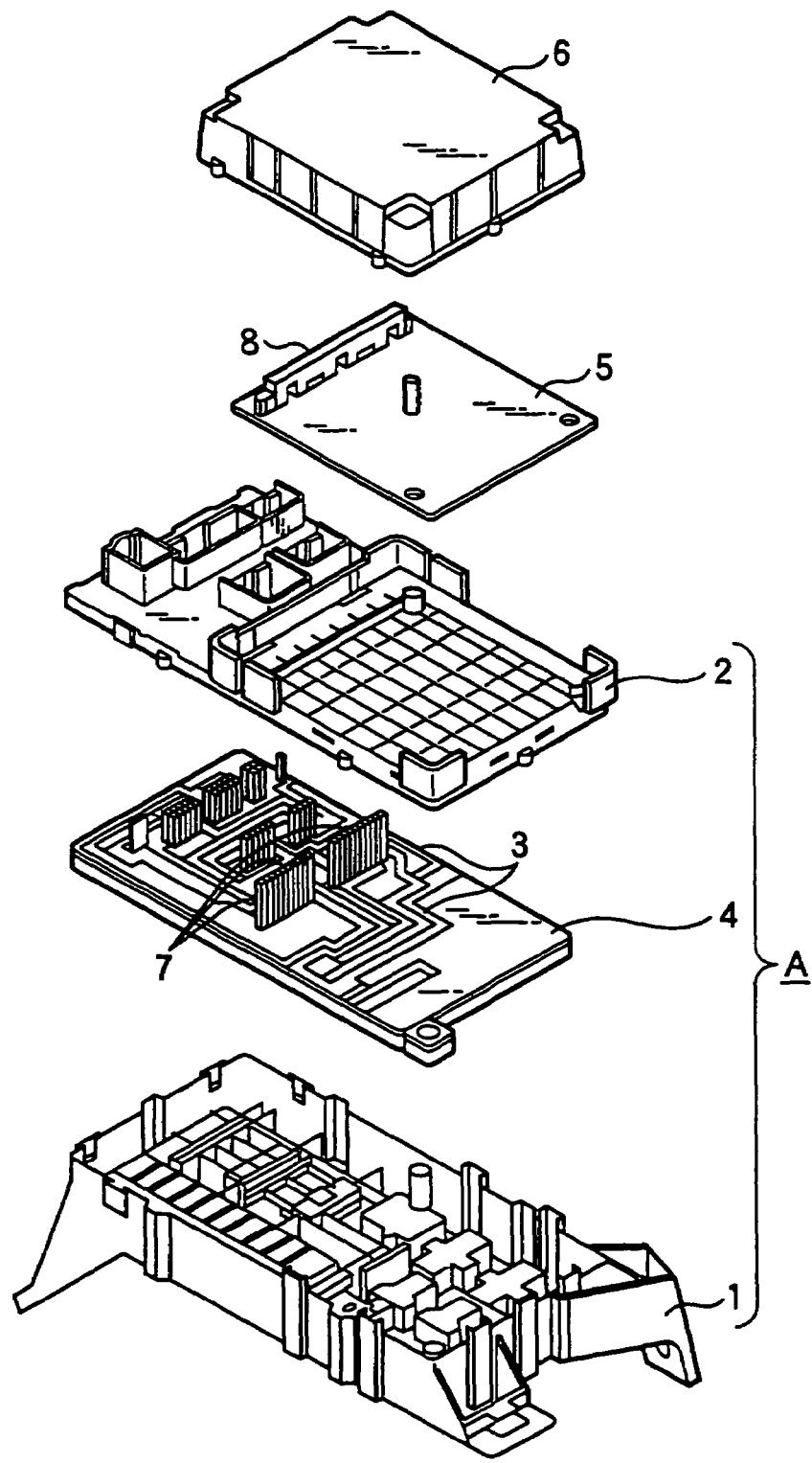
FIG. 11 is an exploded perspective view of a printed circuit board of an electronic control unit and a junction block to which the invention is applied.
Figure 12:
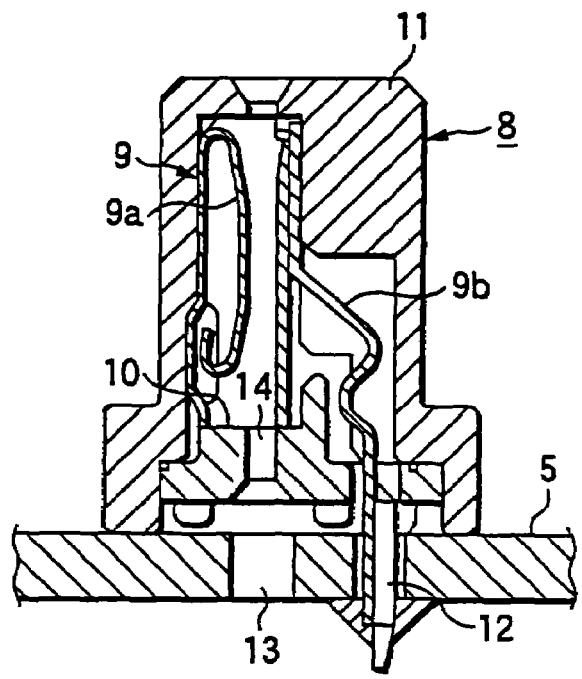
FIG. 12 is an enlarged section view of a connector of the electronic control unit.
Figure 13:
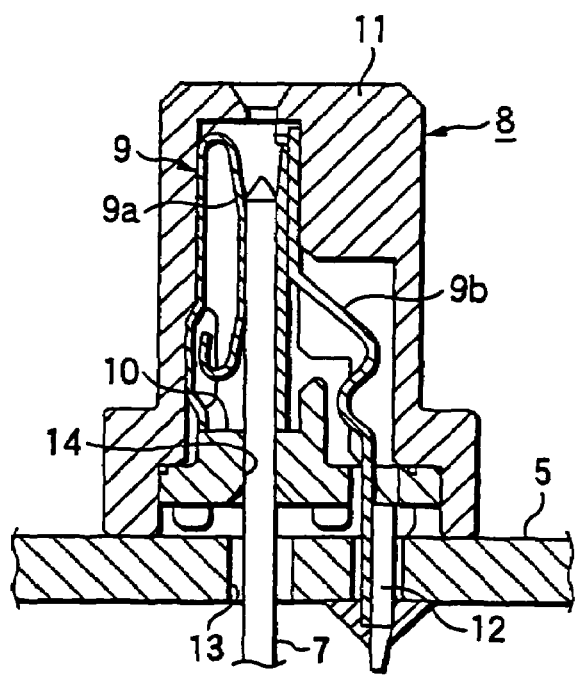
FIG. 13 is a view corresponding to FIG. 12 and showing a state where a male terminal is inserted into a female terminal of the connector.

Since the portions of the movable elements 15 which are to be in contact with and pushed by the respective male terminals 7 are configured by the insulators 15a, the current of the conduction test is prevented from flowing through the movable element 15 to the side of the male terminals (the side of the bus bars 3 in FIG. 11), and hence the conduction test can be performed more accurately.

(Second and Third Embodiments) (see FIGS. 7 to 10)

Only differences from the first embodiment will be described.

Figure 7:
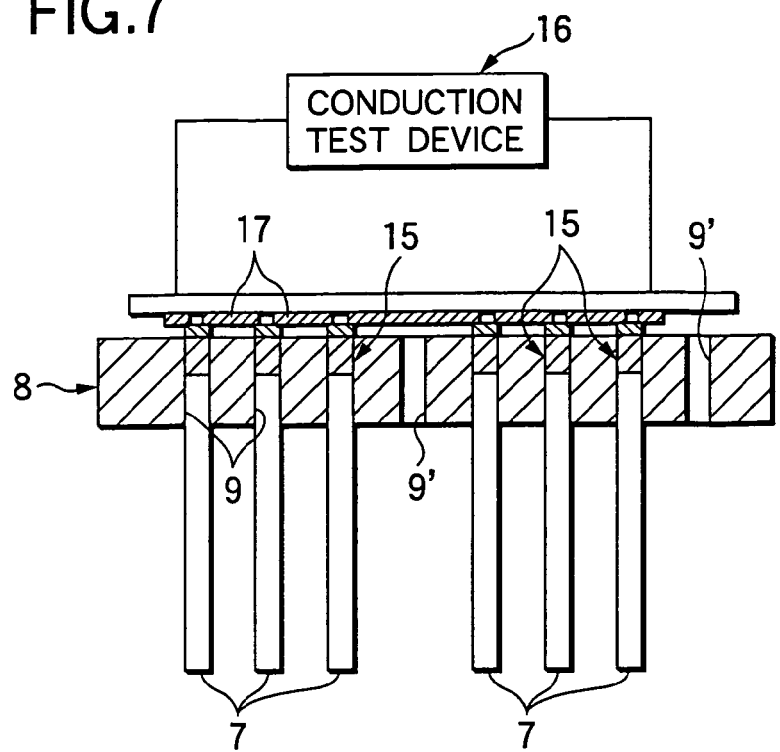
FIG. 7 is a diagrammatic section view showing a state where, in a second embodiment of the invention, a correct connection condition is made in the case where movable elements are disposed in only female terminals into which male terminals are to be inserted.
Figure 8:
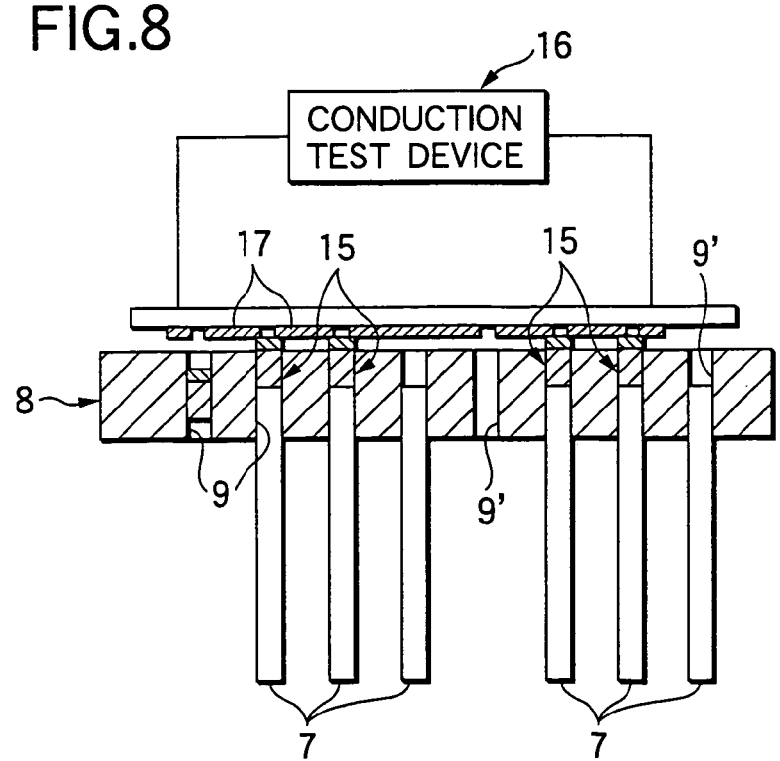
FIG. 8 is a view corresponding to FIG. 7 and showing an incorrect connection condition in the second embodiment.

In the second embodiment shown in FIGS. 7 and 8, the male terminals 7 are arranged in a center-void state where the male terminals 7 lack in the center, and the movable elements 15 are disposed in only the to-be-connected female terminals 9 to which the male terminals 7 are to be inserted (none of the movable elements 15 are disposed in the excess female terminals 9').

In this case, the conductive portions 17 of the conduction test device 16 are laid out so that the portion corresponding to the center excess female terminal 9' is always conductive.

Figure 9:
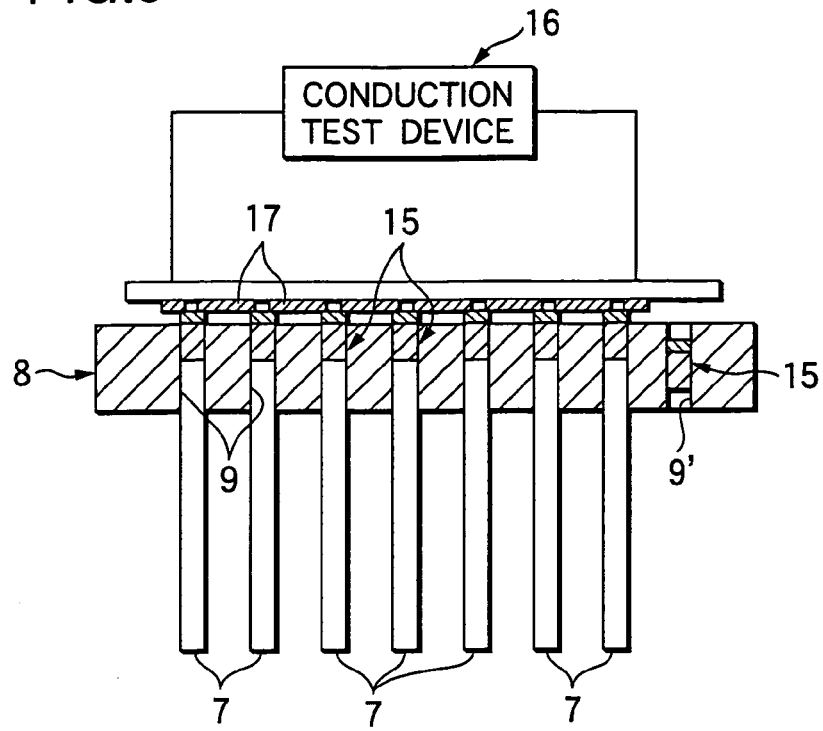
FIG. 9 is a diagrammatic section view showing a state where, in a third embodiment of the invention, a correct connection condition is made in the case where movable elements are disposed in all female terminals.
Figure 10:
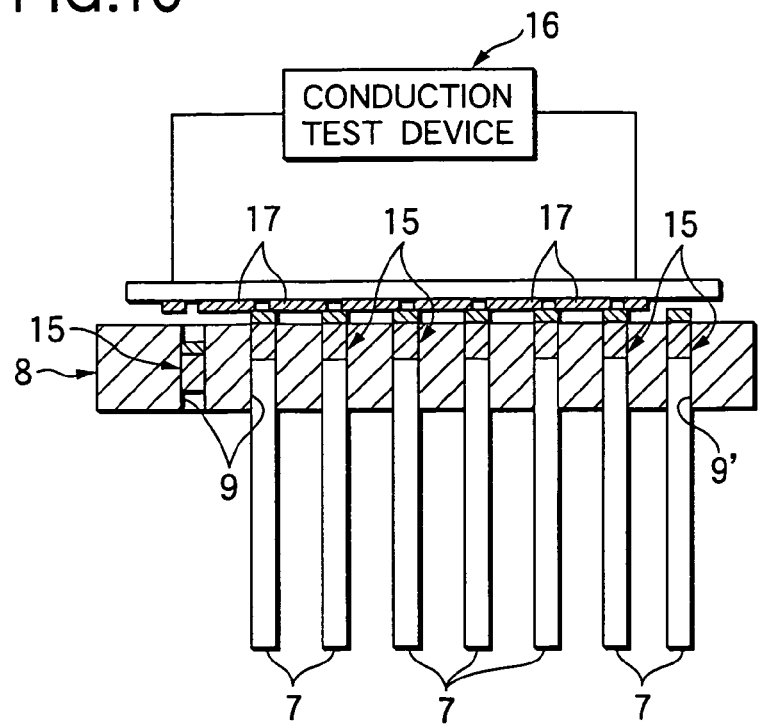
FIG. 10 is a view corresponding to FIG. 9 and showing an incorrect connection condition in the third embodiment.

By contrast, in the third embodiment shown in FIGS. 9 and 10, the movable elements 15 are disposed not only in the to-be-connected female terminals 9 and also in the excess female terminal 9' which is at the right end in the figures.

In both the embodiments, (A) in the correct connection condition, as shown in FIGS. 7 and 9, all the conductive portions 17 from end to end are conductive, and (B) in an incorrect connection condition, as shown in FIGS. 8 and 10, one of the movable elements 15 fails to be moved to the conduction position, so that the conduction condition cannot be made.

In both the embodiments, it is possible to attain the same effects as those of the first embodiment.

In the configuration of the second embodiment, the movable elements 15 are requested to be disposed in only the to-be-connected female terminals 9 into which the male terminals 7 are to be inserted, and therefore the movable elements 15 can be reduced to a required minimum number.

By contrast, in the configuration of the third embodiment, the movable elements 15 can be mechanically set into all the female terminals 9 and 9'. Therefore, it is possible to eliminate a labor of selecting female terminals, and also to prevent the female terminals from being erroneously selected.

The invention can be applied not only to a terminal connecting portion which is between a junction block and an electronic control unit for an automobile, and which has been described in the above-mentioned examples, but also to various kinds of terminal connecting portions.

EFFECTS OF THE INVENTION

As described above, according to the invention, an electrically conductive movable element which is moved from a waiting position to a conduction position by an insertion operation of corresponding one of male terminals is disposed in each of at least the to-be-connected female terminals, and, only when the male terminals are correctly inserted into the female terminals (at the correct positions and in the correct depth), the movable elements are moved to the respective conduction positions to be in contact with the conductive portions of the conduction test device, thereby attaining a connection condition. Therefore, correctness of the connection condition can be more easily and accurately detected as compared with the conventional art in which a functional test is performed.

What is claimed is:

1. A method of confirming connection of a terminal connecting portion in which a plurality of male terminals are inserted respectively into a plurality of female terminals to make an electrical connection therebetween, said method comprising:

disposing electrically conductive movable elements in at least all to-be-connected female terminals into which said male terminals are to be respectively inserted in a correct connection condition;

moving said movable elements from a waiting position to a conduction position by inserting a corresponding one of said male terminals, such that each of the movable elements is electrically isolated from the corresponding male and female terminals when in the conduction position; and detecting a state where all of said movable elements in said to-be-connected female terminals are moved respectively to said conduction positions by a conduction test device having conductive portions which, when said movable elements are moved to said conduction positions, are in contact with said movable elements, respectively.

2. The method according to claim 1, the disposing step further including disposing the movable elements such that each include a section formed of an electrical insulator and a section formed of an electrical conductor.

3. The method according to claim 2, the moving step further including pushing the electrical insulator section of each of the movable elements with the corresponding one of the male terminals.

4. The method according to claim 3, the pushing step further including pushing the movable elements in a linear direction, the linear direction corresponding to a direction and extension of each of the male terminals.

* * * * *